United States Patent [19]

VonHayn et al.

[11] Patent Number: 4,898,360
[45] Date of Patent: Feb. 6, 1990

[54] VALVE BLOCK ASSEMBLY

[75] Inventors: Holger VonHayn, Bad Vilbel; Joachim Maas, Griesheim, both of Fed. Rep. of Germany

[73] Assignee: Alfred Teves GmbH, Frankfurt Am Main, Fed. Rep. of Germany

[21] Appl. No.: 281,312

[22] Filed: Dec. 7, 1988

[30] Foreign Application Priority Data

Dec. 17, 1987 [DE] Fed. Rep. of Germany ....... 3742830

[51] Int. Cl.⁴ .............................................. F16K 31/02
[52] U.S. Cl. ........................... 251/129.01; 251/129.15
[58] Field of Search ....................... 251/129.01, 129.15; 137/870, 884

[56] References Cited

U.S. PATENT DOCUMENTS 4,387,739 6/1983 Schaming .................. 251/129.15 X
4,524,797 6/1985 Lungo ........................ 251/129.15 X
4,785,848 11/1988 Leiber .............................. 137/884 X

FOREIGN PATENT DOCUMENTS 3701019 7/1988 Fed. Rep. of Germany .

Primary Examiner—Arnold Rosenthal
Attorney, Agent, or Firm—Robert P. Seitter

[57] ABSTRACT

A valve block comprising a plurality of electromagnetic valves (2, 3) and a valve cap (16) and including an electric power supply for applying electric power to the coils of the electromagnetic valves, and wherein a printed circuit board (14) is utilized. The printed circuit board is mountable as a component unit onto all contact points of the coils (6, 7, 8, 9) of the electromagnetic valves. The printed circuit board carries conductor tracks for electrically connecting coils (6, 7, 8, 9) to the outgoing cable of the valve block (1). The printed circuit board (14) exhibits a contact device (21) in which all tracks are terminated. Through the contact device (21), the electrical connection to the connecting cable (28) is established. Accordingly, a simplified assembly of the valve block is provided, and the valve block assembly is water-tight and sealed against the ingress of dirt and vapor into the engine space.

5 Claims, 3 Drawing Sheets

VALVE BLOCK ASSEMBLY

BACKGROUND OF THE INVENTION

The present invention relates to a valve block assembly composed of one or more electromagnetically actuable hydraulic valves, a valve cap or lid, and a power supply means for applying electric power to the coils of the electromagnetic valves.

Electrohydraulic controls are being increasingly used in the art because it is possible for the control part of a control chain to be of an electrical configuration and, for the energy part of the control chain, to be of a hydraulic configuration. The points of connection between electrical and hydraulic parts comprise electromagnetically actuated hydraulic valves. The valves are combined to form components (valve blocks) and are provided with incoming and outgoing lines and include one or more outgoing cables. Disposed in the cables are electrical lines for the control signals for switching the electromagnetic valves, that is, for applying electric power to the coils of the electromagnetic valves.

German Patent Application No. P3701019.0 describes a valve block for a slip-controlled hydraulic brake system comprising a valve-accommodating body receiving a plurality of electromagnetic valves; a frame; a cap closing the frame; and plug assembly including a plurality of contact blades, with the electromagnetic valves in communication with the contact blades through a connecting foil. The special feature characterizing the valve block is that the frame is integrally formed with the cap and the plug assembly such that an integral cover unit is provided enabling the connecting foil to be soldered and sealingly secured to the valve-accommodating body.

Systems of the afore-described type comprising a valve block and an appertaining cap, in practice have several disadvantages, and the mechanical mounting of the cap on the valve block presents special difficulties. Automatic mounting require complex procedures. The automatic assembly of valve block and cap presents centering and sealing problems. Moreover, problems are involved with fastening and sealing the electrical leads for the coils of the electromagnetic valves.

Prior arrangements of valve blocks including caps comprise a cable attachment in the cap comprising a threading. As it is necessary, during manufacture and assembly of valve block and cap, for the cap to be opened to enable contacts to be inspected and repaired, such as, to be soldered or welded, complex procedures have been employed to this date. Heretofore, screw fastening of the cable has had to be backed off and the cap pushed back onto the cable hose to enable the contacts of the electromagnetic valves to be soldered. After soldering, the cap is placed into the mounting position to then refasten the cable by screwing.

The afore-described disadvantages involved with the state of the art are overcome by the present invention. Heretofore, the coils of the electromagnetic valves in the valve block have been connected through a resilient connecting foil soldered to the plug connectors. In other state-of-the-art valve block assemblies, the contact points of the coils of the electromagnetic valves have Deen soldered to individual cables guided by the afore-described screwing arrangement through the cap housing.

SUMMARY OF THE INVENTION

It is an object of the invention to simplify this complex handling. The procedure of mounting the cap to the valve block in accordance with the present invention is performed in a manner less complex and, hence, more economical. Moreover, the invention ensures that the contact points are sealed against the ingress of moisture, dirt and vapor, especially petrol vapor, into the engine space.

In the practice of the invention, these problems are overcome in that a printed circuit board is provided which is mountable as a single unit on all electric contact points of the coils and comprises current-carrying tracks establishing electrical connections between the coils and an outgoing cable of the valve block. The printed circuit board for the outgoing cable comprises a contact means common to all tracks, which is of a configuration such that the removable plug (plug connector) of the connecting cable can be plugged directly onto the printed circuit board forming a part of the contact means.

According to another embodiment of the present invention provision is made for the printed circuit board which is made of an insulating material provided on which are the tracks, that the guided-together tracks are located in the contact means and that they comprise contact pins.

A preferred embodiment of the present invention provides a plug housing for the connecting cable of the valve assembly which housing in particular, is made of a flexible and sealing material pushable on a cap projection, and the plug housing is provided with a plug connector pushable on a part of the printed circuit board formed as a plug assembly.

An alternative embodiment of the present invention provides that a plug housing for the outgoing cable of the valve assembly which in particular, is made of a flexible and sealing material pushable on a cap projection and which comprises a plug pushable on a displaceable plug assembly held by a displaceable plug assembly-accommodating body slidingly guided in the cap projection configured as a guiding means. The plug assembly-accommodating body is provided with a plug sweeping upon displacement of the plug connector housing and the plug assembly-accommodating body at least over the marginal area of the printed circuit board provided with one or more ends of the tracks while establishing an electrical contact.

A particularly inexpensive, economical and simple mounting method is provided in that the printed circuit board is furnished with premanufactured tracks and is so configured and disposed as to be mountable, during assembly, to the electrical connections of the coils, especially to the pins of the coils, thereby establishing electrical contacts. Subsequently, all electrical contacts can be soldered, the cap is mountable to the valve block surrounding the printed circuit board, and that the plug assembly of the printed circuit board can be connected to the plug of the connecting cable.

According to the present invention, the afore-described disadvantages involved with the present state of the art devices are avoided. Improved conditions are provided for enabling the printed circuit board and the cap to be mechanically mounted to the valve block, insuring a reliable electrical attachment and sealing of lines. Nut screwing for securing the connecting cable is eliminated. This is particularly advantageous in cases where the cap, after assembly, will have to be removed from the valve block to perform repair and inspection work, thereby eliminating troublesome up-folding required according to prior art practice as described in the noted German Offenlegungsschrift No. P 3701019.0.

BRIEF DESCRIPTION OF THE DRAWING

Further details of the invention are described in the following description of two embodiments of the present invention taken in conjunction with the accompanying drawing wherein.

DETAILED DESCRIPTION OF A PREFERRED EMBODIMENT

Figure 1:
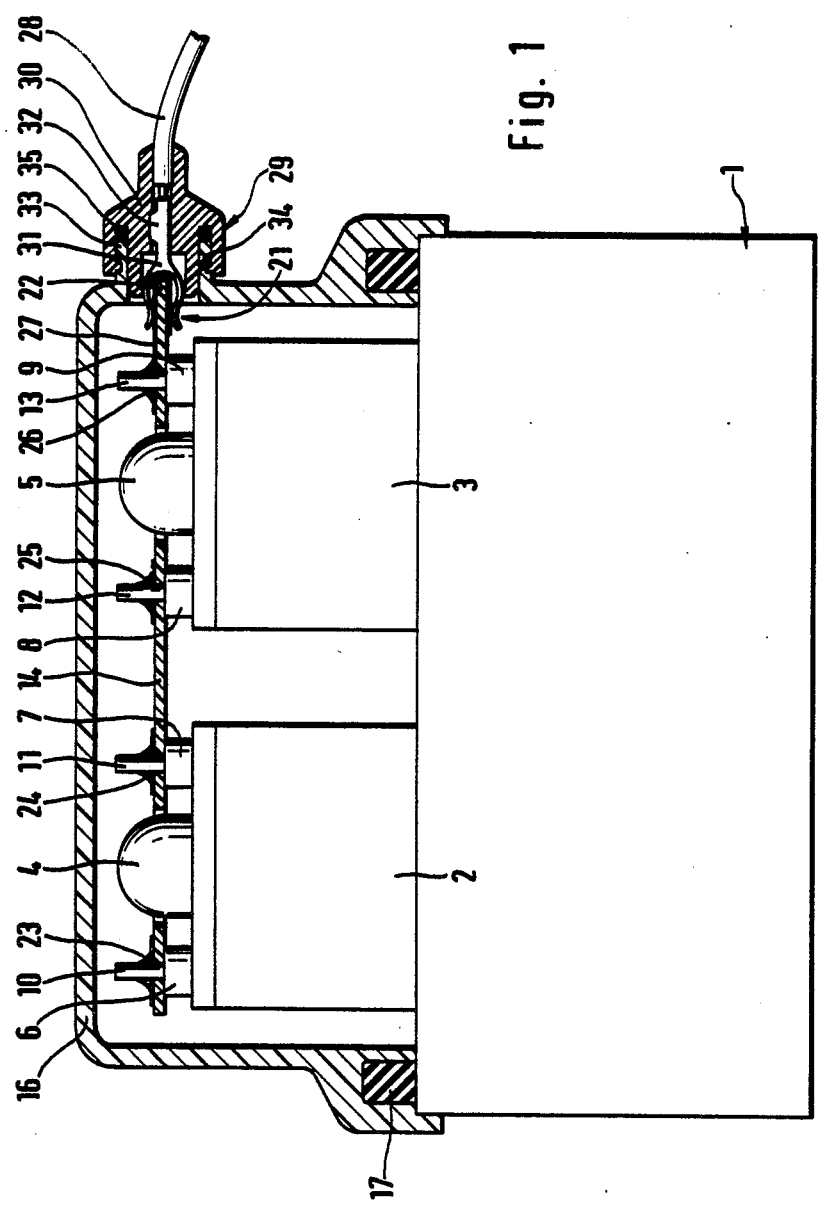
FIG. 1 is a partial sectional view of the first embodiment of the present invention.
Figure 2:
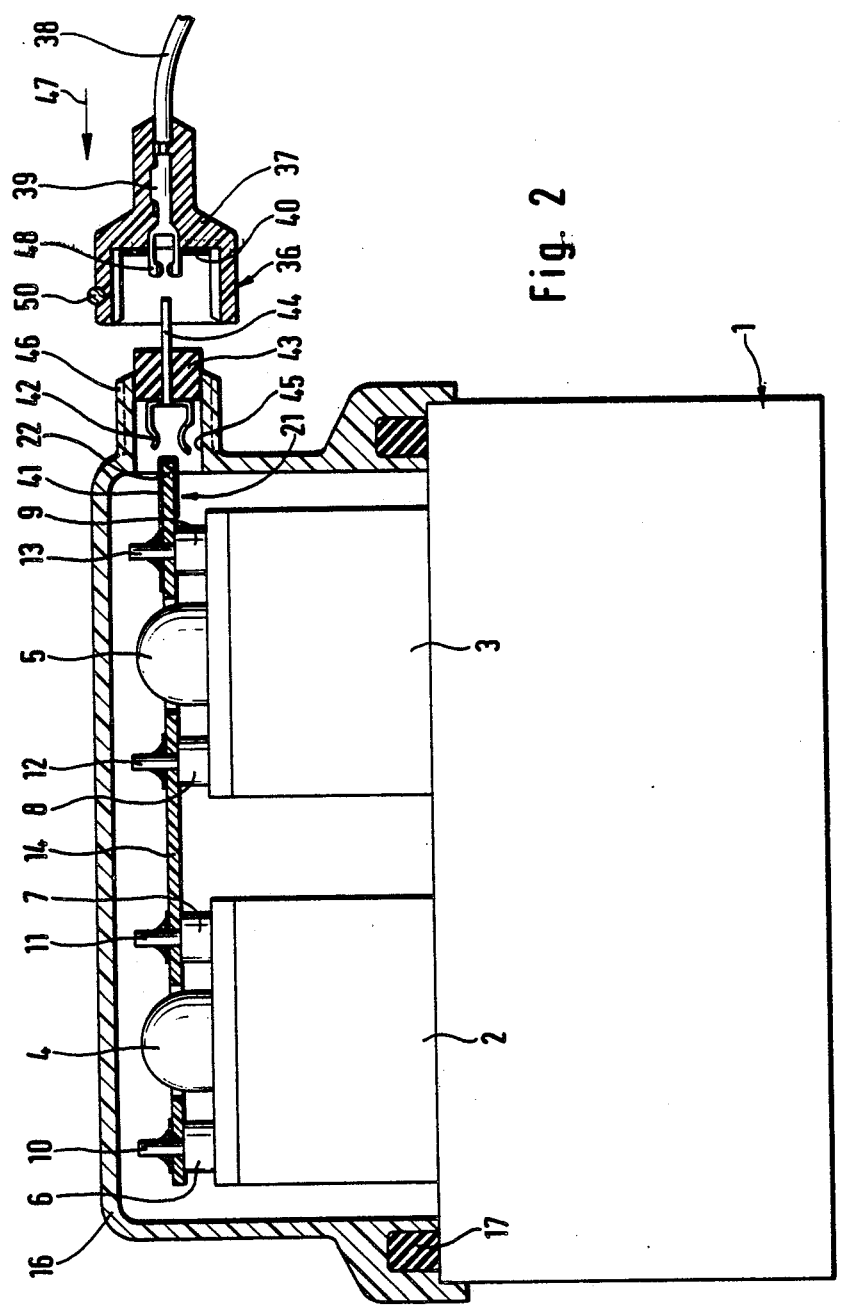
FIG. 2 is a partial sectional view of the second embodiment of the present invention; and, FIG. 3 is a scaled-down plan view of the printed circuit board.
Figure 3:
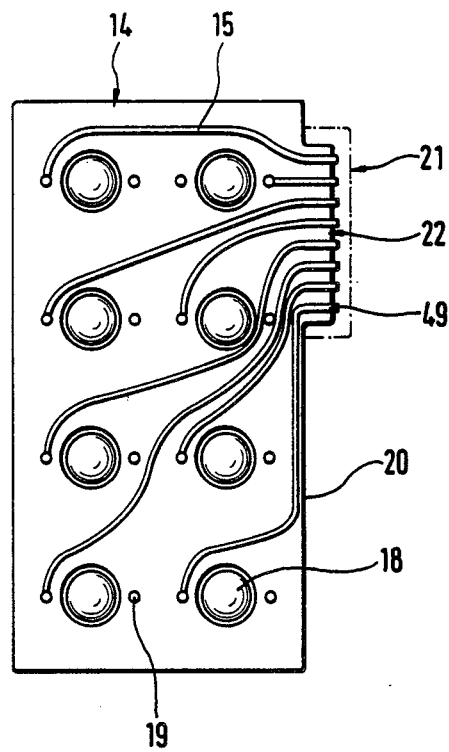

The valve block is designated by reference numeral 1, while numerals 2, 3 refer to the electromagnetic valves. FIGS. 1 and 2 show the upper ends 4, 5 of the valves. Moreover, the upper ends 6, 7, 8, 9 of the coils of the electromagnetic valves are shown therein. Provided on the coils are contact pins designated by reference numerals 10, 11, 12, 13. Numeral 14 identifies the printed circuit board made of insulating material and exhibiting tracks. The position of the tracks is shown in FIG. 3. One of the tracks is designated in FIG. 3 by numeral 15. Valve block 1 is provided with a cap 16. Disposed between cap 16 and valve block 1 is a gasket 17.

In FIG. 3 are the upper ends of the electromagnetic valves are illustrated therein. Eight electromagnetic valves are combined to form a valve block. One of the upper ends of the electromagnetic valves is designated in FIG. 3 by numeral 1B. One of the electrical connections for the coils belonging to the electromagnetic valves is designated in FIG. 3 by numeral 19. FIG. 3 illustrates that the tracks 15 are lead together in a marginal area 20 of the printed circuit board to form contact points of a contact means. The contact means is schematically shown in broken lines. The contact means as a whole is designated by reference numeral 21. An essential component of the contact means is a plug assembly carrying the contact points of all conductor tracks 15. The plug assembly in its entirety, is designated by numeral 22 in FIG. 3. One of the contact points is identified by numeral 49.

As shown in FIG. 1, the printed circuit board 14 is soldered to pins 10, 11, 12, 13. The solder material is designated by numerals 23, 24, 25, 26. Reference character 21 in FIG. 1, identifies the contact means which is located in the marginal area of the printed circuit board. Numeral 27 refers to a conductor track forming an integral part of the plug assembly 22. The outgoing cable 2B according to FIG. 1 exhibits a plug connector which in its entirety, is designated by numeral 29. The connector plug essentially is made up of a plug housing 30 manufactured from a resilient sealing material. The plug housing 30 accommodates the end of cable 2B along with a plug contact element 31 which through a crimp 32 is in communication with the core of the connecting cable. The cap exhibits a projection 33 framing the plug assembly. The projection exhibits a peripheral groove 34 engageable by a peripheral projection of the plug housing. Numeral 35 refers to a sealant sealing the cap projection 33 against the plug housing 30.

When establishing the connection between the printed circuit board and the conductor tracks, respectively, provided on the printed circuit board, and the connecting cable, the following steps are taken:

Plug housing 30 is pushed onto cap projection 33, with the plug contact element 31 pushed over the plug assembly 22 and the marginal area of the printed circuit board, respectively, thereby establishing a safe electrical contact. At the same time, the rim of the plug housing is displaced beyond the cap projection to an extent that a peripheral projection of the plug housing engages the groove 34 of the cap projection 33, thereby attaining a reliable anchoring of the plug housing on the cap of the valve block.

FIG. 2 shows a plug connector designated, in its entirety, by numeral 36. It consists of a plug housing 37 which, in the interior thereof, includes the end of cable 38. The core of the cable, through a crimp 39, is in communication with the outer contact element 48. Numeral 40 identifies a sealant. The printed circuit board according to FIG. 2 is designated by numeral 14. As shown in FIG. 3, the printed circuit board carries tracks with one of such tracks being shown in FIG. 2 and designated by numeral 41, establishing the contact between pin 13 and plug assembly 22. The inner plug contact element 42 is fixed in the displaceable plug assembly-accommodating body 43 and is in communication with the plug assembly 44. As shown in FIG. 2, the plug assembly 44 is of displaceable designed the plug assembly 44 is accommodated in a plug assembly-accommodating body 43. Displaceability of the plug assembly 44 is ensured in that the plug assembly-accommodating body is displaceably disposed in a guide means 45 located within the cap projection 46.

Establishing the contact between the connecting cable 38 and the tracks provided on the printed circuit board 44 requires the following steps to be taken:

Plug 36 is pushed onto cap projection 46 in the direction of arrow 47 with a contact being established between the displaceable plug assembly 44 and the outer plug contact element 4B. Subsequently, the displaceable plug assembly 44 with the plug assembly-accommodating body is displaced to the left, thereby pushing the inner plug contact element 42 onto the marginal area of the printed circuit board forming the plug assembly 22 such that a contact is established between the marginal area of the printed circuit board and the inner plug contact element 42.

Numeral 50 schematically shows the cross-section of a flexible wire element or spring element configured as a fastening buckle or bracket which upon termination of the push-on operation clamps the plug housing to the cap projection. The spring element can be pre-mounted. In that case, the plug housing would be forced by a pre-mounted spring element onto the cap projection. The cap projection may exhibit a depression, preferably a groove, engaged by a spring portion of the plug housing through the flexible wire element, thereby ensuring a form-locking connection and seal.

While two embodiments have been described the present invention is not restricted to those embodiments. Other plug connections between the tracks on the printed circuit board and the connecting cable can be employed without departing from the scope and spirit of the invention. For example, a common printed circuit board for all coils of the electromagnetic valves of a valve block can be provided.

What is claimed is:

1. A valve block assembly comprising, in combination: a housing enclosing a portion of said valve block assembly, one or more electromagnetically actuable hydraulic valves, a value cap, a power supply means for applying electric power to the coils of the electromagnetic valves through a plurality of electrical contact points, wherein a printed circuit board is provided which is mountable on all of said electrical contact points of the coils as one component unit, and including electrical tracks to establish electrical connections between the coils and an outgoing cable of the valve block, wherein the printed circuit board includes a contact means for an output cable common to all tracks, which contact means is configured so that a removable plug contact of the connecting cable is directly plugged over an edge portion of the printed circuit board forming part of the contact means and a projection of said housing extending away from said edge portion and generally parallel to said printed circuit board for receiving and supporting said plug contact.

2. A valve block assembly according to claim 1, wherein the printed circuit board is made of insulating material provided on which said tracks a provided, that the said tracks are disposed in guided-together manner in the contact means and exhibit contact points.

3. A valve block assembly according to claim 1, wherein a plug housing is provided for the connecting cable of the valve assembly, which plug housing comprises a resilient and sealing material on a cap projection, wherein said plug housing is provided with a plug pushable on a part of the printed circuit board configured as a plug assembly.

4. A valve block assembly according to claim 1, wherein a plug housing is provided for the outgoing cable of the valve assembly which comprises a flexible and sealing material, which can be pushed on a cap projection and which includes a contact element on a displaceable plug assembly held by a displaceable plug assembly-receiving slidingly guided in the cap projection formed as a guiding means, where in the plug assembly-receiving member is provided with a contact element which upon displacement of the plug housing and of member sweeps a marginal area of the printed circuit board provided with one or more ends of track, with an electrical contact thereby being established.

5. A valve block assembly according to claim 1 wherein the printed circuit board is furnished with pre-manufactured tracks and is arranged to be mountable during assembly onto pins of said coils in establishing electrical contacts, wherein all electrical contacts are subsequently soldered, wherein the cap, in surrounding the printed circuit board, is mountable on the valve block. and wherein the plug assembly of the printed circuit board is connected to the plug connector of the connecting cable.

* * * * *